(12) United States Patent
Clifford et al.

(10) Patent No.: US 8,739,098 B1
(45) Date of Patent: May 27, 2014

(54) EUV MASK DEFECT RECONSTRUCTION AND COMPENSATION REPAIR

(71) Applicant: GlobalFoundries Inc., Grand Cayman, KY (US)

(72) Inventors: Christopher H. Clifford, San Francisco, CA (US); Fan Jiang, Wilsonville, OR (US); Pawitter Mangat, Clifton Park, NY (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 13/771,478

(22) Filed: Feb. 20, 2013

(51) Int. Cl.
*G06F 17/50* (2006.01)

(52) U.S. Cl.
USPC .......................................................... 716/112

(58) Field of Classification Search
USPC ............................................... 716/100, 112
See application file for complete search history.

(56) References Cited

U.S. PATENT DOCUMENTS

| | | | |
|---|---|---|---|
| 7,043,071 B2 | 5/2006 | Qian et al. | |
| 7,302,672 B2 * | 11/2007 | Pack et al. | 430/5 |
| 7,565,001 B2 | 7/2009 | Cai et al. | |
| 8,142,958 B2 | 3/2012 | Holfeld | |
| 2005/0216877 A1 * | 9/2005 | Pack et al. | 716/19 |
| 2012/0238096 A1 * | 9/2012 | Xiong et al. | 438/694 |

* cited by examiner

*Primary Examiner* — Suchin Parihar
(74) *Attorney, Agent, or Firm* — Darrell L. Pogue; Keohane & D'Alessandro PLLC (57) ABSTRACT

Embodiments of the invention provide approaches for extreme ultraviolet (EUV) defect reconstruction and compensation repair. Specifically, a defect starting point of a defect of a mask is determined, and the performance of the mask with the defect is simulated. The simulated performance of the mask is compared to an empirical analysis of the mask to produce a profile of the mask and the defect. An initial image of the mask geometry, with the defect, is calculated, and then compared to a target image of the mask. From this, a compensated layout is generated. As such, embodiments provide a EUV fabrication system that detects and corrects for defects in the blanks and patterned masks to avoid or counteract the defect. Once a compensated pattern has been designed and successfully simulated, the mask may be patterned with the compensated design.

20 Claims, 10 Drawing Sheets

EUV MASK DEFECT RECONSTRUCTION AND COMPENSATION REPAIR

BACKGROUND

1. Technical Field

This application relates to extreme ultraviolet (EUV) lithographic integrated circuit (IC) wafer fabrication and, more particularly, to a method and system for detecting and compensating for defects in EUV masks to improve IC fabrication quality.

2. Related Art

To fabricate an IC in a semiconductor substrate, a physical representation of the IC is transferred onto a pattern tool, which is then exposed to transfer this pattern onto the semiconductor substrate. A mask is a standard pattern tool used in IC processing. Typically, a mask includes patterns that can be transferred to the entire semiconductor substrate (for example, a wafer) in a single exposure. A reticle, another standard pattern tool, must be stepped and repeated to expose the entire substrate surface. For ease of reference herein, the term "mask" refers to either a reticle or a mask.

EUV lithographic IC fabrication involves patterning the mask onto an EUV mask blank to create a reticle that is used to etch the IC onto silicon wafers. A blank may consist of a low thermal expansion (LTE) substrate with a Mo/Si multilayer that reflects 13.5 nm light, which is the wavelength used for exposing the photoresist used for producing the integrated circuit patterns onto the wafers. A patterned reticle is fabricated by printing an absorber layer over the mask blank employing an electron beam writing tool that defines reflective traces corresponding to the desired pattern for IC fabrication. When the patterned reticle is exposed to EUV light, the reflective traces defined by the mask reflect the EUV light onto the silicon wafer, where the reflected light exposes a photoresist with the pattern defined by the mask. After additional develop and etch processes, this creates an integrated circuit on the wafer.

Unfortunately, the EUV mask blanks inevitably include some defects that can result in errors in the integrated circuits when etched onto the silicon wafers. These defects can occur at multiple levels within the blank. Defects within or beneath the multilayer usually are called multilayer defects. They may, for instance, comprise particles, which are disposed beneath the multilayer or which are enclosed within the multilayer, deformations of the multilayer due to bumps or pits on the substrate surface, like scratches, or local variations of the layer thickness or the roughness of single layers of the multilayer. These defects may cause a variation of the amplitude or the phase of a radiation reflected by the multilayer. The resulting phase difference in reference to the radiation reflected by portions without defects may cause variations of the intensity of the reflected radiation due to interferences.

Prior mask manufacturing technologies have not adequately addressed the challenges of defect detection, defect mitigation, and patterned mask repair for defects occurring at multiple levels within blanks in EUV lithographic fabrication of IC wafers. As such, current art approaches are inadequate for at least the reasons described above.

SUMMARY

In general, embodiments of the invention provide approaches for defect reconstruction and compensation repair. Specifically, a defect starting point of a defect of a mask is determined, and the performance of the mask with the defect is simulated. The simulated performance of the mask is compared to an empirical analysis of the mask to produce a profile of the mask and the defect. An initial image of the mask geometry, with the defect, is calculated, and then compared to a target image of the mask. From this, a compensated layout is generated. As such, embodiments provide a EUV fabrication system that detects and corrects for defects in the blanks and patterned masks to avoid or counteract the defect. Once a compensated pattern has been designed and successfully simulated, the mask may be patterned with the compensated design.

One aspect of the present invention includes a method for defect reconstruction and compensation repair, the method comprising: determining a defect starting point of a defect of a mask; simulating a performance of the mask with the defect; comparing the simulated performance of the mask to an empirical analysis of the mask; determining a profile of the mask and the defect based on the comparing; determining a geometry of the mask and the defect based on the comparing; determining a geometry of the mask based on the profile of the mask and the defect; calculating an initial image of the mask geometry and a target image of the mask, the target image generated from a post-optical proximity correction layout; and generating a compensated layout from the comparison of the initial image of the mask geometry to the target image of the mask.

Another aspect of the present invention includes a computer program product for defect reconstruction and compensation, the computer program product comprising: a computer readable storage device storing computer program instructions, the computer program instructions being executable by a computer to optimize illumination and polarization, the computer program instructions comprising: determining a defect starting point of a defect of a mask; simulating a performance of the mask with the defect; comparing the simulated performance of the mask to an empirical analysis of the mask; determining a profile of the mask and the defect based on the comparing; determining a geometry of the mask and the defect based on the comparing; determining a geometry of the mask based on the profile of the mask and the defect; calculating an initial image of the mask geometry and a target image of the mask, the target image generated from a post-optical proximity correction layout; and generating a compensated layout from the comparison of the initial image of the mask geometry to the target image of the mask.

Another aspect of the present invention provides a method for EUV defect reconstruction and compensation repair, comprising: determining a defect starting point of a defect of a mask; simulating a performance of the mask with the defect; comparing the simulated performance of the mask to an empirical analysis of the mask; determining a profile of the mask and the defect based on the comparing; determining a geometry of the mask and the defect based on the comparing; determining a geometry of the mask based on the profile of the mask and the defect; calculating an initial image of the mask geometry and a target image of the mask, the target image generated from a post-optical proximity correction layout; and generating a compensated layout from the comparison of the initial image of the mask geometry to the target image of the mask.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are approaches for defect reconstruction and compensation repair. Specifically, a defect starting point of a defect of a mask is determined, and the performance of the mask with the defect is simulated. The simulated performance of the mask is compared to an empirical analysis of the mask to produce a profile of the mask and the defect. An initial image of the mask geometry, with the defect, is calculated, and then compared to a target image of the mask. From this, a compensated layout is generated. As such, embodiments provide a EUV fabrication system that detects and corrects for defects in the blanks and patterned masks to avoid or counteract the defect. Once a compensated pattern has been designed and successfully simulated, the mask may be patterned with the compensated design.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

Figure 1:
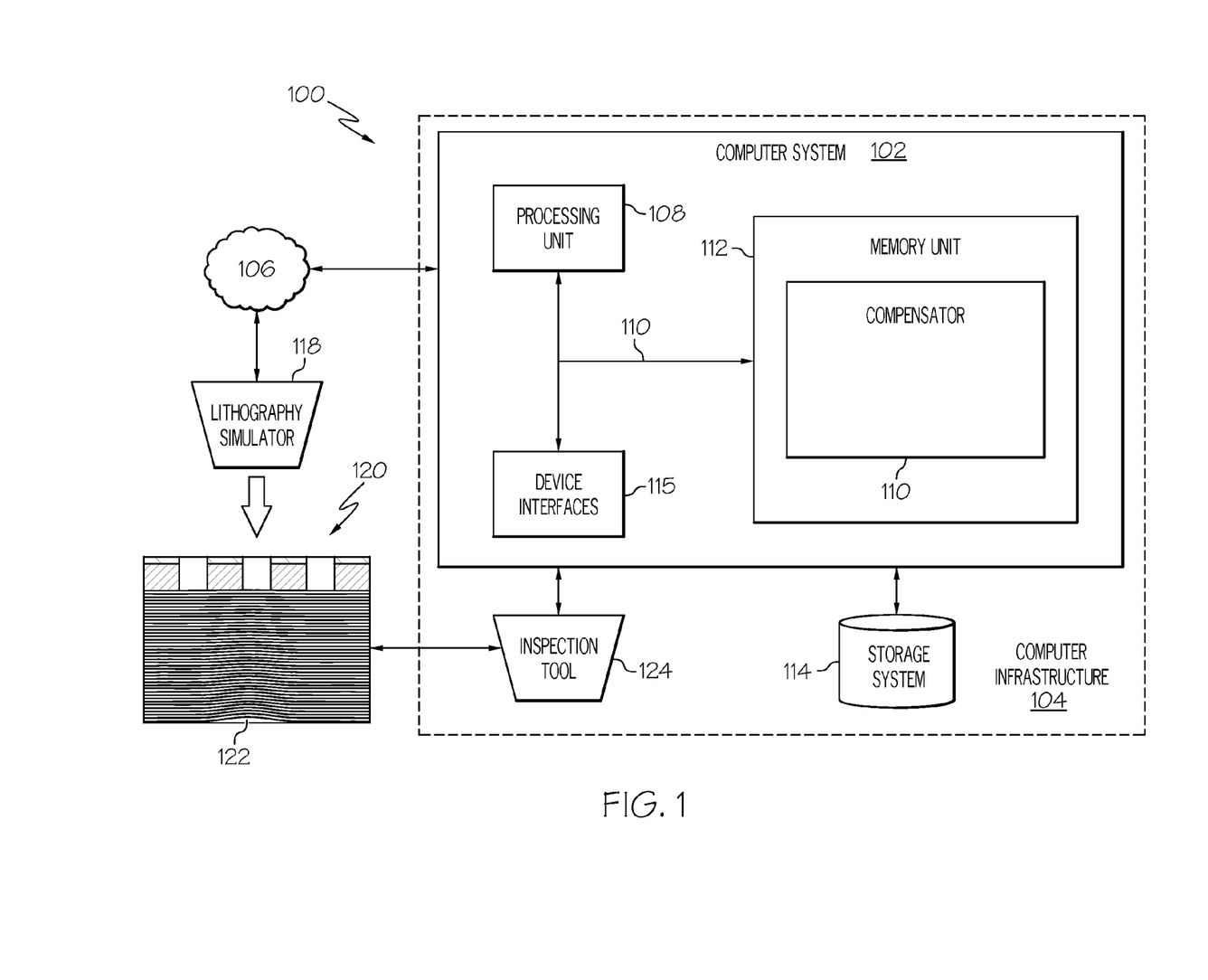
FIG. 1 shows a schematic of an exemplary computing environment according to illustrative embodiments.

With reference now to the figures, FIG. 1 depicts a system 100 that facilitates defect reconstruction and compensation repair. As shown, system 100 includes computer system 102 deployed within a computer infrastructure 104. This is intended to demonstrate, among other things, that embodiments can be implemented within a network environment 106 (e.g., the Internet, a wide area network (WAN), a local area network (LAN), a virtual private network (VPN), etc.), a cloud-computing environment, or on a stand-alone computer system. Still yet, computer infrastructure 104 is intended to demonstrate that some or all of the components of system 100 could be deployed, managed, serviced, etc., by a service provider who offers to implement, deploy, and/or perform the functions of the present invention for others.

Computer system 102 is intended to represent any type of computer system that may be implemented in deploying/realizing the teachings recited herein. In this particular example, computer system 102 represents an illustrative system for optimizing optical lithography illumination and polarization. It should be understood that any other computers implemented under various embodiments may have different components/software, but will perform similar functions. As shown, computer system 102 includes a processing unit 108 capable of operating with a compensator 110 stored in a memory unit 112 to provide data center cooling, as will be described in further detail below. Also shown is a bus 113, and device interfaces 115.

Processing unit 108 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 108 receives signals transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 108 executes computer program code, such as program code for operating compensator 110, which is stored in memory unit 112 and/or storage system 114. While executing computer program code, processing unit 108 can read and/or write data to/from memory unit 112 and storage system 114. Storage system 114 may comprise VCRs, DVRs, RAID arrays, USB hard drives, optical disk recorders, flash storage devices, and/or any other data processing and storage elements for storing and/or processing data. Although not shown, computer system 102 could also include I/O interfaces that communicate with one or more hardware components of computer infrastructure 104 that enable a user to interact with computer system 102 (e.g., a keyboard, a display, camera, etc.). As will be described in further detail below, compensator 110 of computer infrastructure 104 is configured to operate with a lithography simulator 118 and a inspection tool 124 for simulating features of a mask 120, including one or more defects 122, and compensating for the defect to ensure that acceptable circuit performance can be expected achieved.

In exemplary embodiments, mask 120 is a EUV mask comprising a substrate, a reflective multilayer, a phase-shifting material, and a masking material. The substrate may be any kind of substrate or carrier material, such as glass or ceramic, and may comprise further layers. The multilayer is disposed on top of the substrate. The multilayer may be a layer stack comprising, for instance, 30 to 60 periods of alternating layers, which, for instance, comprise materials with different refractive indices, like molybdenum and silicon. A period of these layers may, for instance, have a thickness of about 7 nm. Furthermore, intermediate layers are disposed on some or all interfaces within a period of these layers, for instance molybdenum/ruthenium/silicon or molybdenum/carbon/silicon.

The masking material is disposed in a portion of the substrate on top of the multilayer. The masking material may be an absorbing, reflective, or phase-shifting material or may comprise a layer stack of different materials. The masking material may, for instance, be a metal, such as chromium, tantalum, titanium, aluminum, or tungsten, or metal compounds, such as TaN, TaBN, TaSix, or TiN, or a reflective layer stack similar to the multilayer or a phase-shifting material comprising, for instance, a material selected from the group of zirconium, molybdenum, beryllium, carbon or silicon dioxide. The masking material corresponds to the mask patterns of mask 120.

Figure 2:
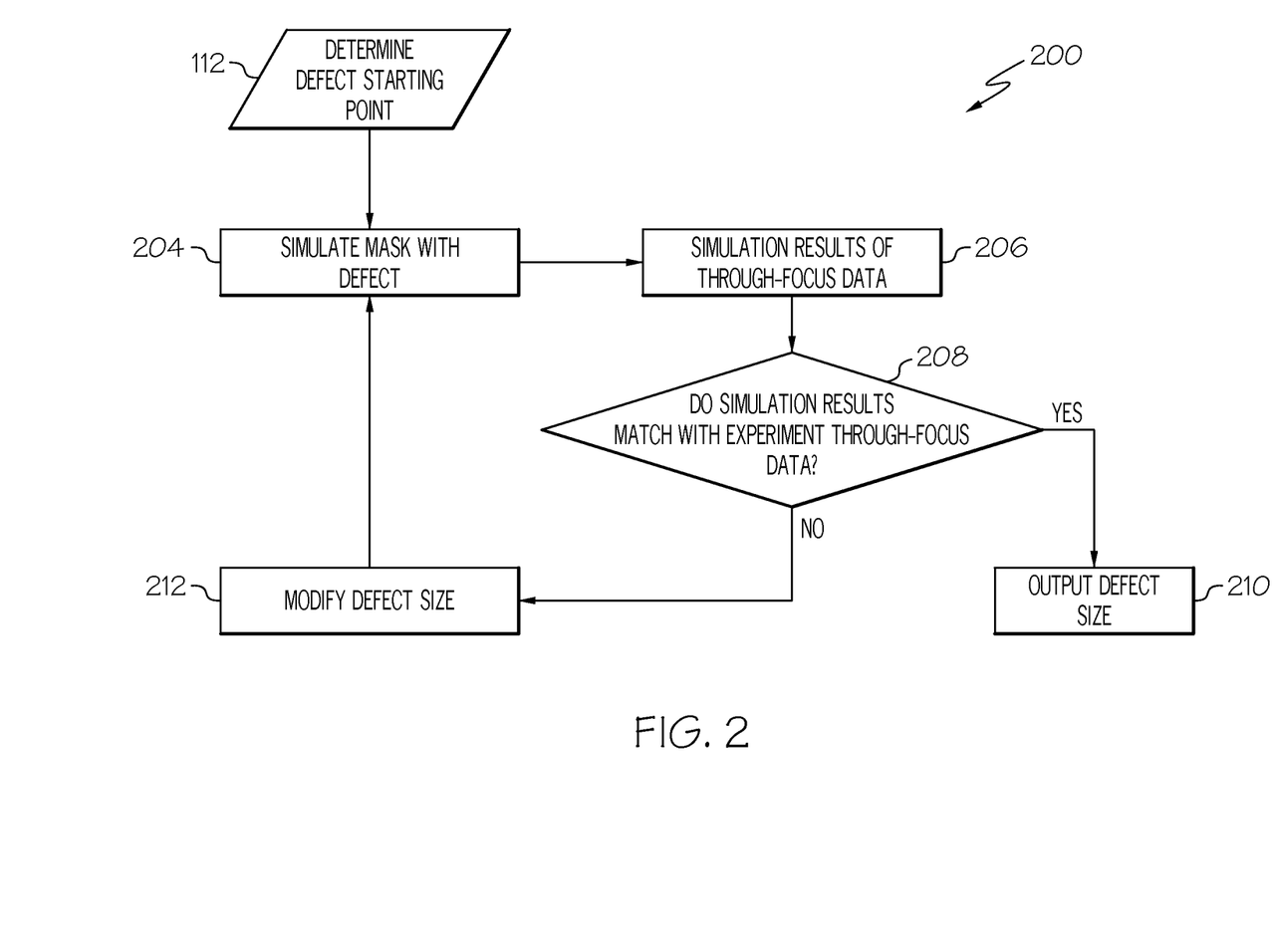
FIG. 2 shows a process flow for defect determination according to illustrative embodiments.

Referring now to FIG. 2, a method for defect reconstruction will be described in greater detail. In exemplary embodiments, FIG. 2 is a functional block diagram of a EUV defect reconstruction process 200, which identifies defects and characterizes the defects as to location, size and depth. A nominal mask pattern is simulated taking the defect into account to determine the expected impact of the defect on IC functionality. As shown, process 200 begins at 202 by determining a defect starting point. In this step, an estimated size and position of defect 122 for mask 120 under analysis is determined, e.g., from a defect map measurement. In this example, defect maps of a mask substrate created by a supplier of the mask substrate or inspection methods of the mask substrate or of the patterned mask may be used for determining the size, location, and depth of the defect area. For example, optical scattering may be used to identify and map defect distributions in mask 120 (e.g., provided as x/y coordinates). Defect maps are useful for map-to-map comparison to determine adders from a particular process and for defect review on subsequently used analytical tools to identify the source of defect 122.

Step 202 further includes analyzing the size and location of the defects in relation to various mask features. For example, certain defects, when viewed solely with respect to the polysilicon region on the mask, could be deemed substantial in relation to the diffusion region provided on the mask. Specifically, process 202 may use information from various masks to identify critical regions of the IC. Thus, by analyzing multiple masks and the features therein, defect 122 could be characterized as insubstantial because it is small and in a non-critical region (e.g. the interconnect), whereas defect 122 could be characterized as substantial even though it is small because it is in a critical region of the IC (e.g. the gate).

Next, at 204, performance of mask 120 with defect 122 is simulated. With the size/location information relating to defect 122, a lithographic simulation program of lithography simulator 118 is used to calculate the effect of defect 122 on the pattern to be printed on the wafer. Lithography simulator 118 can generate a simulated test wafer image of mask 120 with defect 122. In other words, lithography simulator 118 can use the mask and defect image, as well as the transmission, phase, and shape information for each image, to accurately simulate the wafer exposures mask 120 would provide under a given set of stepper conditions. Further processing can be performed to determine a severity of defect 122, e.g. to output a defect severity score.

Figure 3:
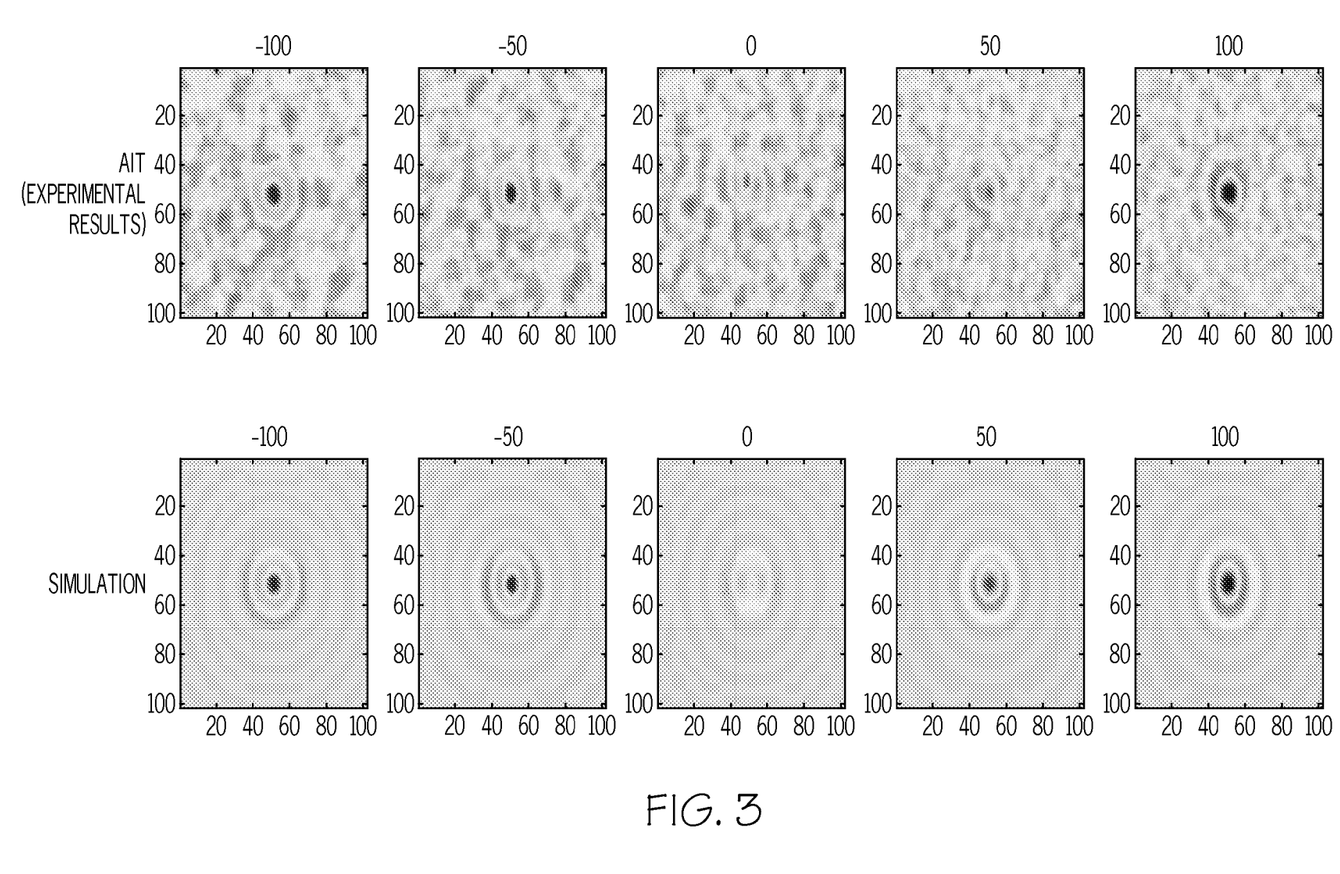
FIG. 3 shows simulated and empirical results of a mask and defect according to illustrative embodiments.

Next, at 206, simulation results of through-focus data are output from lithography simulator 118, and compared to experimental through-focus data at 208. That is, as shown in FIG. 3, the simulated performance of mask 120 with defect 122 is compared to an empirical analysis of mask 120, e.g., as determined by an inspection tool 124 (FIG. 1). In exemplary embodiments, mask 120 can be inspected by a suitable inspection technique, such as actinic inspection using wavelengths consistent with wavelengths used by a photolithography system that can accommodate a reflective mask, wherein the wavelengths incident on mask 120 can correspond to specific angles of incidence. The mask data is received from inspection tool 124, and processed to smooth out statistical variations (i.e., static). This empirical model is capable of capturing the 3D-effects of mask 120, including defect 122. In exemplary embodiments, inspection tool 124 works in concert with the lithographic simulator 118 that simulates the operation of the mask patterns to determine how nominal and compensated patterns can be expected to operate in view of the defects identified through simulation and by inspection tool 124. Once finalized, the pattern is stored in storage system 114.

Figure 4:
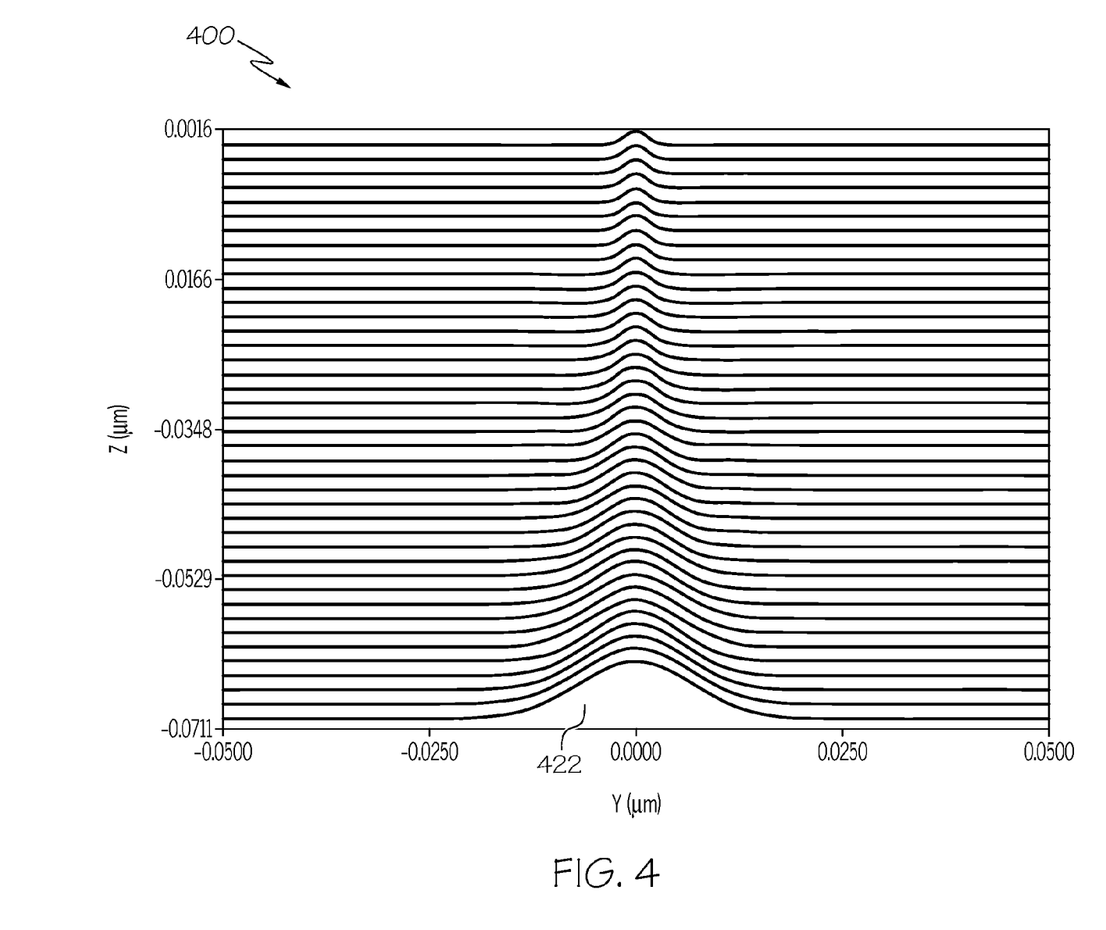
FIG. 4 shows a defect profile according to illustrative embodiments.

After the optimization process, the simulation intensity results are close to the empirical results. As shown at 210, if the simulation results of through-focus data from the simulation of mask 120 with defect 122 match (e.g., within a predetermined statistical similarity) with the experimental through-focus data as determined from inspection tool 124, the output defect size is accepted (i.e., adequately reconstructed). However, if there's no acceptable match, the defect size is modified at 212, and defect reconstruction process 200 returns to step 204. Once the defect size is determined, the multi-layer full stack profile 400 (FIG. 4) can be obtained from the simulation after the optimization.

Figure 5:
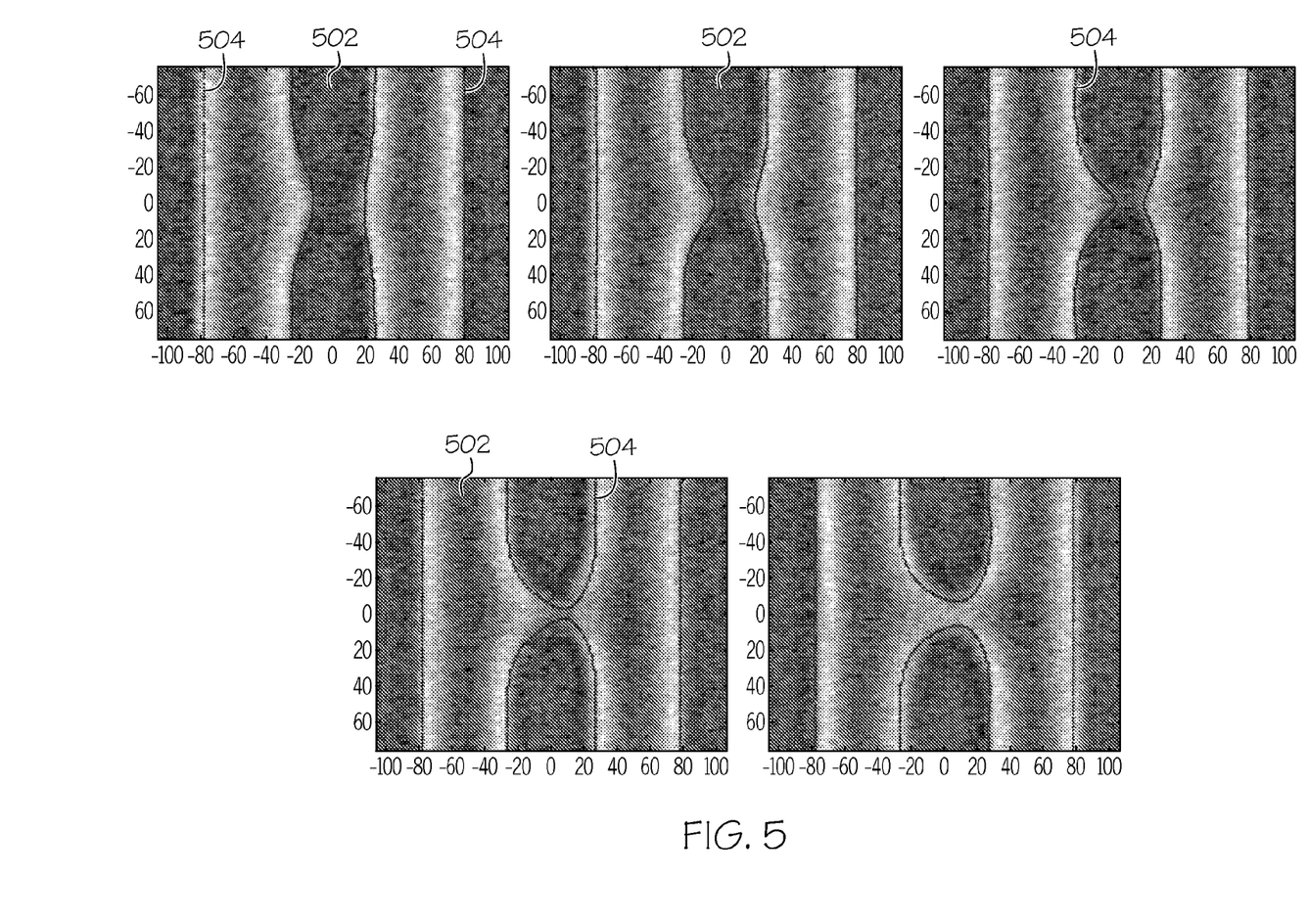
FIG. 5 shows simulated and empirical results of mask and defect through-focus data according to illustrative embodiments.
Figure 6:
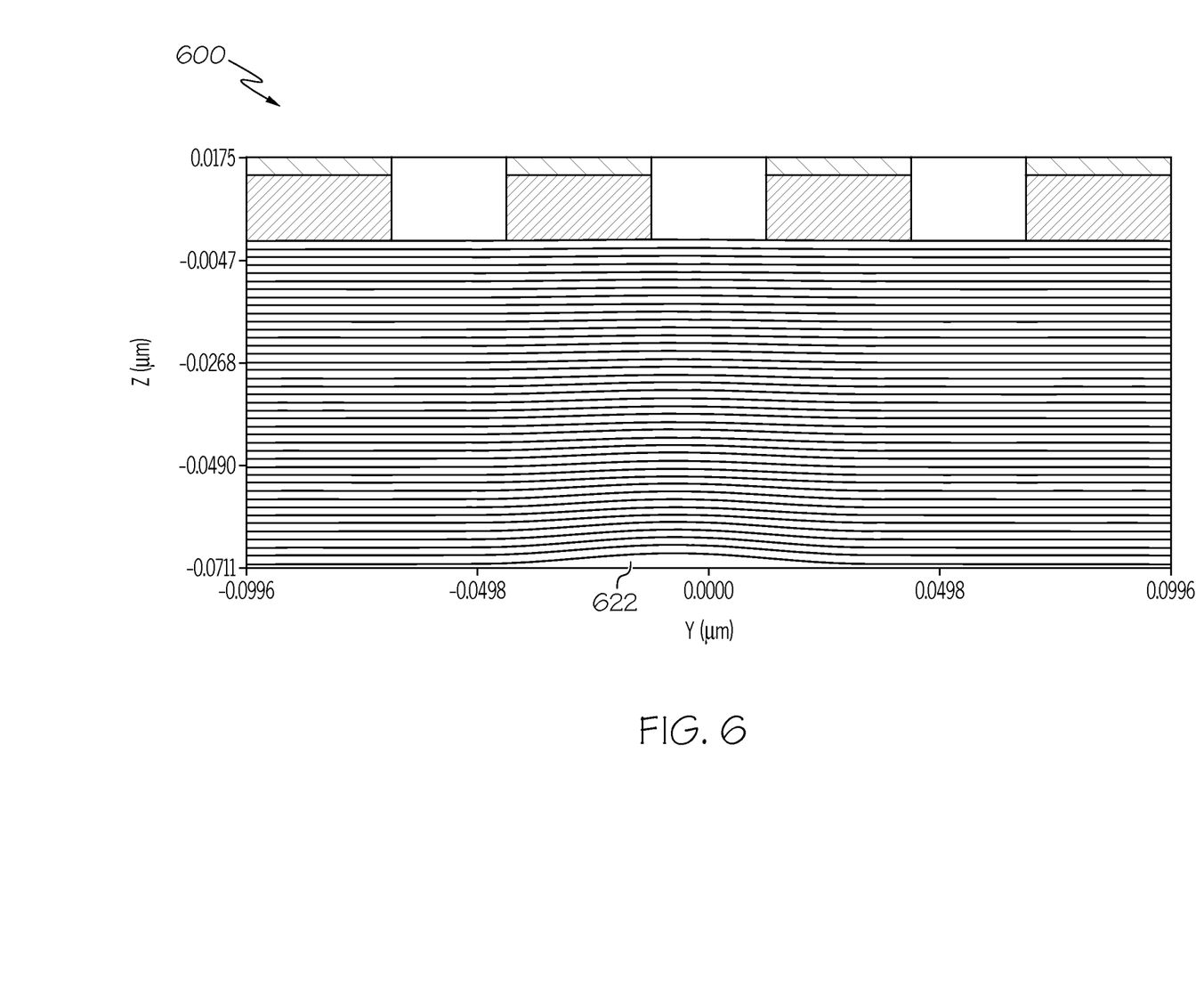
FIG. 6 shows a defect profile of mask according to illustrative embodiments.

Referring now to FIGS. 5-6, reconstruction from wafer exposure of patterned mask 120 will be shown and described in further detail. As demonstrated in FIG. 5, simulation results of through-focus data are output from lithography simulator 118, and compared to experimental through-focus data of inspection tool 124 (FIG. 1). Here, the grayscale image 502 is a scanning electron microscopy (SEM) wafer image of the empirical data, while contour lines 504 represent the simulation result of resist contour after the optimization process. FIG. 6 demonstrates a defect profile 600, including defect 622, resulting from the comparison of the simulation results of through-focus data from mask 120 with defect 122 and the experimental through-focus data as determined from inspection tool 124.

Figure 7:
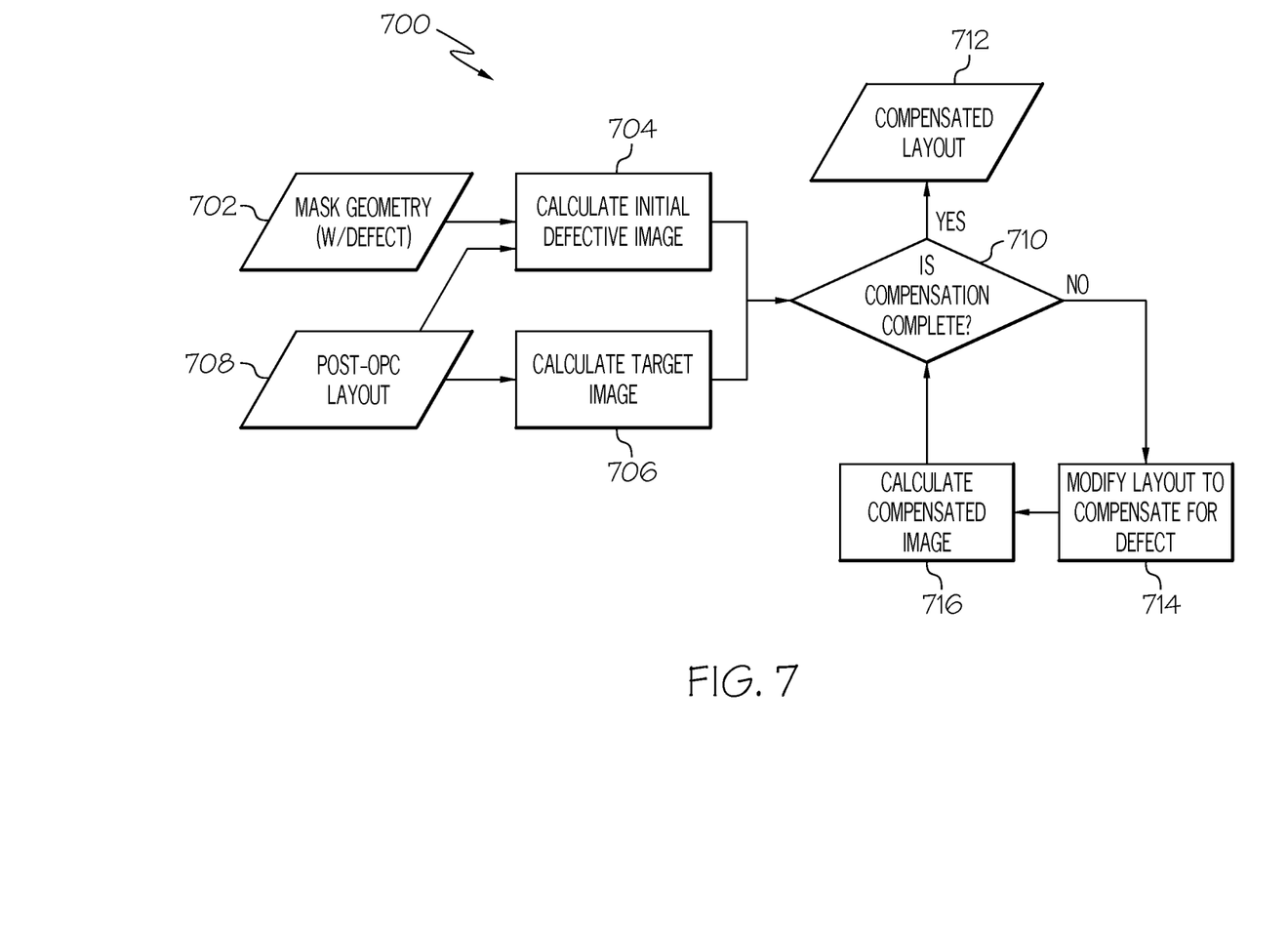
FIG. 7 shows a process flow of defect compensation repair according to illustrative embodiments.
Figure 8:
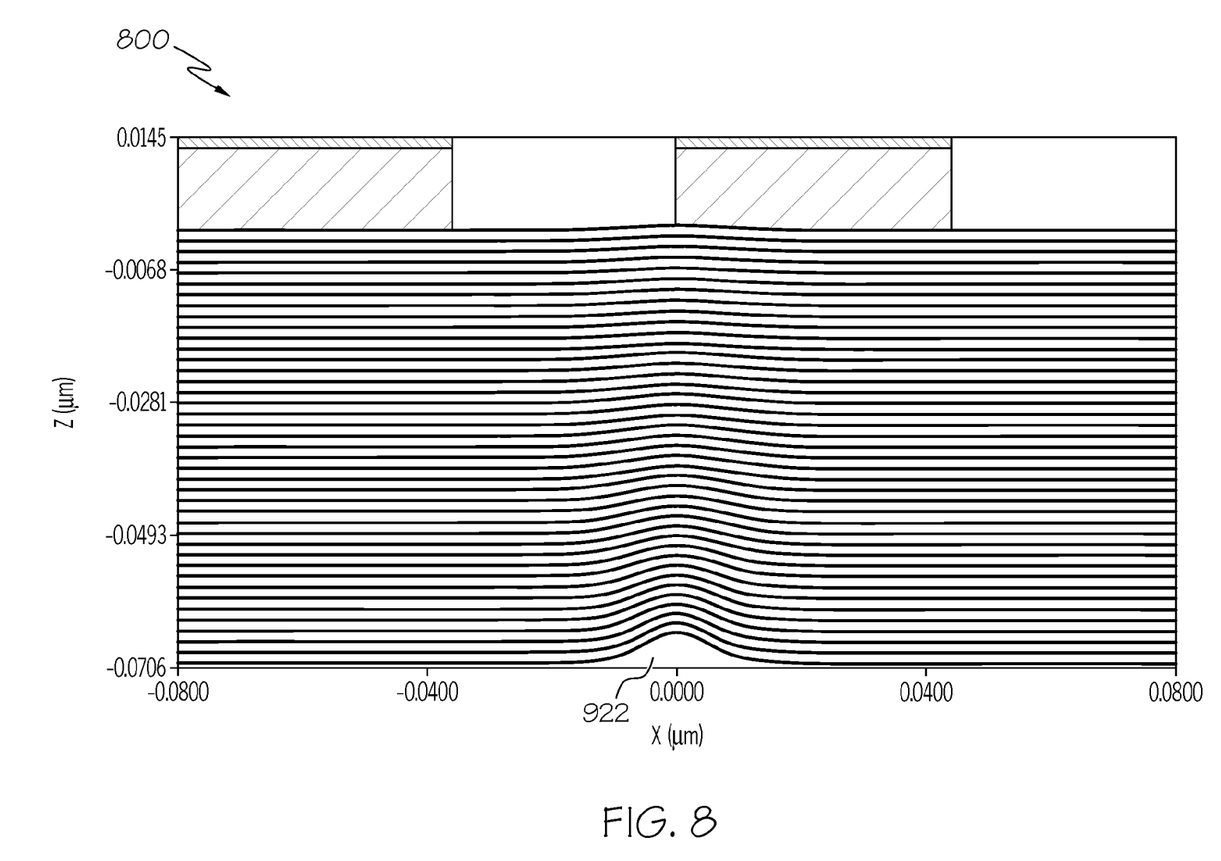
FIG. 8 shows a defect profile of a mask according to illustrative embodiments.

In the event that the defect can be corrected, a compensated pattern is developed to mitigate the defect, as illustrated in FIGS. 7-10. As shown in FIG. 7, a compensation repair process 700 achieves this objective. At 702, the geometry of the mask and defect is determined (e.g., using process 200) to generate the profile 800 shown in FIG. 8. From the mask geometry, an initial image of the mask with the defect is calculated (704), as shown in the pre-compensation image 900 of FIG. 9. In this non-limiting example, pre-compensation image 900 represents a Gremlin 22 nm Design (1× Wafer) having an absorber width of 44 nm, pitch of 80 nm, buried defect 922 (4× Mask, FWHM X: 50 nm, FWHM Y: 50 nm, Height: 20 nm), and surface defect (FWHM X: 80 nm, FWHM Y: 80 nm, Height: 3 nm). The initial defective image (i.e., pre-compensation image 900) is compared to a target image, which is calculated at 706. During this process, a 3-D mask geometry (with or without a defect) is converted to a 2-D image (not shown) representing the final wafer resist by a lithography simulation.

Figure 9:
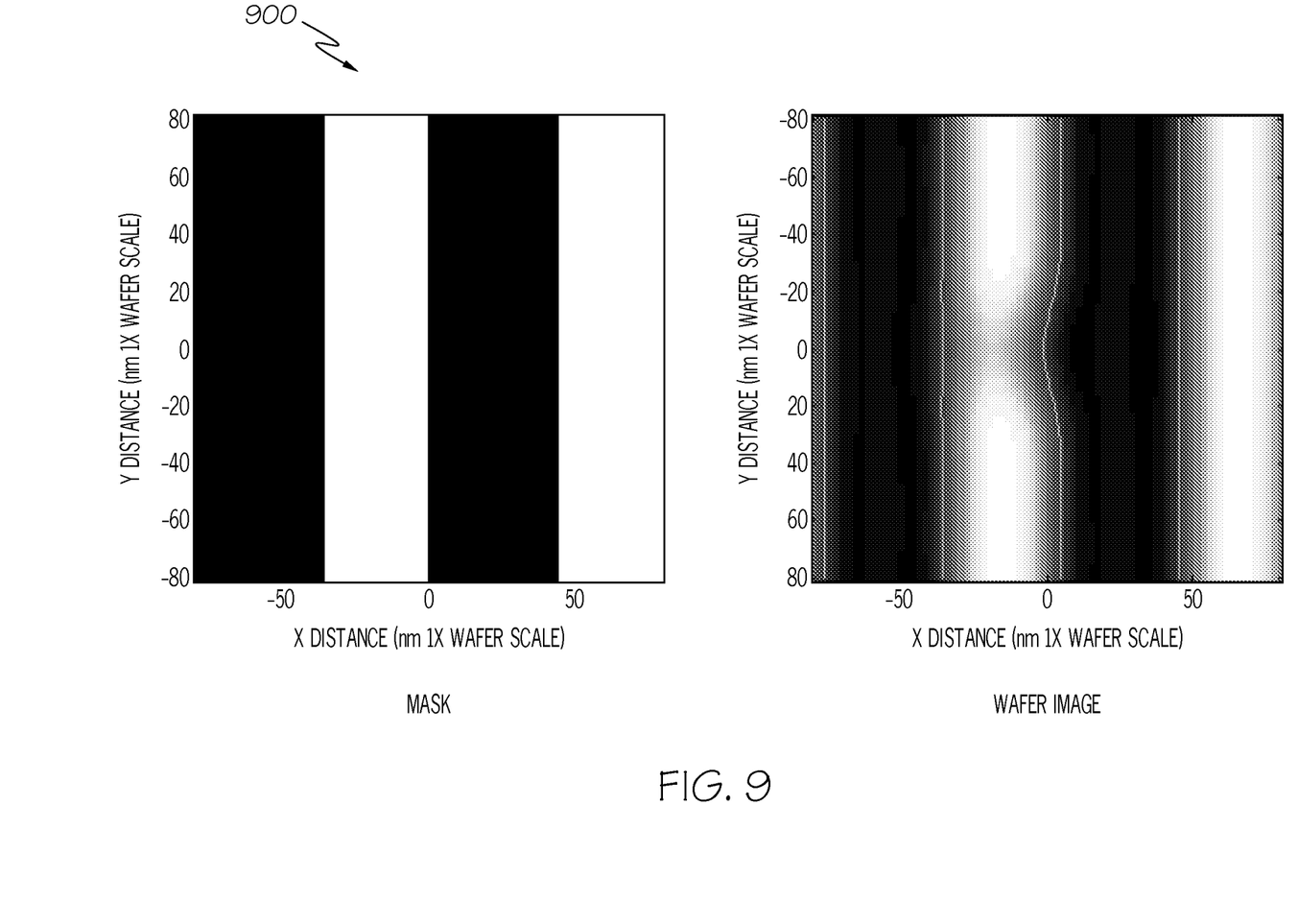
FIG. 9 shows a pre-compensation image according to illustrative embodiments.
Figure 10:
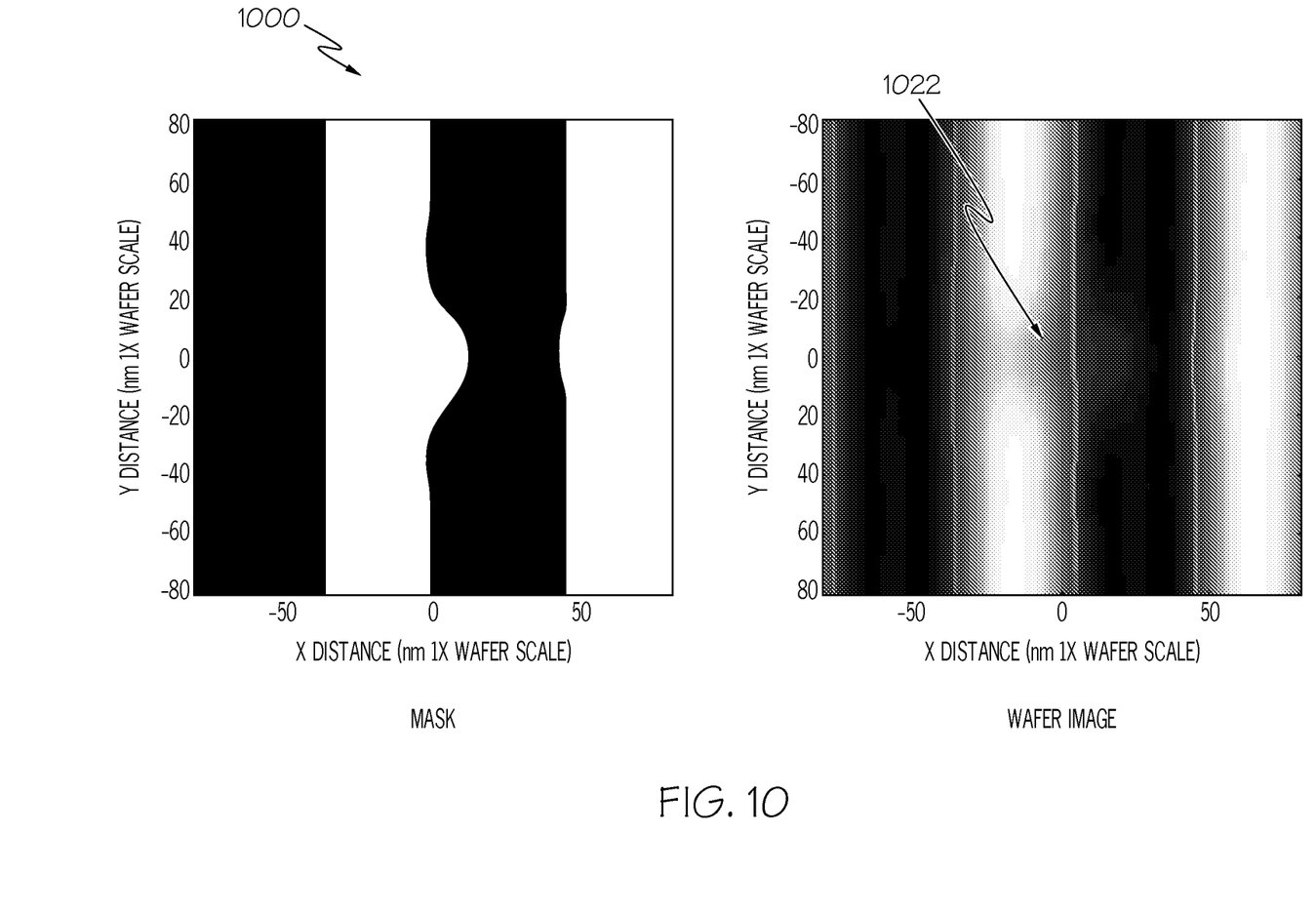
FIG. 10 shows a final simulated result following compensation according to illustrative embodiments.

Target image, as well as pre-compensation image 900 is generated from a post-optical proximity correction (OPC) layout. OPC applies systematic changes to the layout to improve the printability of a wafer pattern. For example, as the size of IC features drops to 0.18μ and below, the features can become smaller than the wavelength of the light used to create such features, thereby creating optical distortions when printing the features onto the wafer. These optical distortions can represent significant impacts on device performance. OPC can include rules to implement certain changes to the layout, thereby compensating for some optical distortions. For example, to compensate for line-end shortening, OPC can add a hammerhead to a line end. Additionally, to compensate for corner rounding, OPC can add (or subtract) serif shapes from outer (or inner) corners. These changes can form features on the wafer that are closer to the original intended layout.

Next, at 710, the initial image is compared to the target image to determine whether the compensation is complete. In exemplary embodiment, compensation is considered complete when the initial defective image matches the calculated target image to within a specification defined by the overall lithography error budget. An example specification could be that all CD errors are <5% of the target CD. If YES, then the layout is adequately compensated at 712, as shown in the final simulated result of FIG. 10. In this case, the thresholded image 1000 has no errors greater than image pixel size, and the defect 1022 is obvious in image intensity. However, if the compensation is not complete, then the layout of the mask is modified at 714 to compensate for defect 922. Once the layout is modified, a compensated image is calculated at 714, and compensation repair process 700 returns to 710 to determine whether compensation is complete. Once an effective repair has been developed, simulated and confirmed, a repair tool (not shown) is used to implement the repair on the printed pattern, which is then ready for IC wafer fabrication.

The preceding description provides one illustrative method in which the present EUV fabrication system detects and corrects for defects in the blanks and patterned masks. As described herein, the mask blank is inspected and a defect in the blank is identified and characterized as to location, size and depth. The nominal mask pattern is then simulated on the mask blank with the known defect to determine the potential effect of the defect on the operation of the circuit. If the defect is correctable, the mask pattern is compensated to avoid or counteract the defect. The compensated pattern is simulated to ensure that acceptable circuit performance can be expected from the compensated pattern. Once a compensated pattern has been designed and successfully simulated, the mask is patterned with the compensated mask.

In order to accomplish this, the circuit designers use information relating to the defect size in all three dimensions. With this information and the location of the defect relative to the absorber pattern to be printed, a lithographic simulation program is used calculate the effect of the phase defect on the pattern to be printed on the wafer. Given this effect, the simulation program can be used to determine how the absorber pattern on the mask needs to be modified, either through pattern compensation implemented by the mask writer prior to patterning the mask or with a repair tool used to correct the reticle after the pattern has been written, in order to mitigate the effect of the defect on the wafer pattern.

The combination of these several techniques into a method for mitigating the effects of defects in EUV patterned masks results in more efficient utilization of blanks arising from the ability to compensate for certain defects as opposed to placing the masks around all of the identified defects.

All of the system and methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

In view of the foregoing, it will be appreciated that present invention provides significant improvements in defect identification and mitigation in EUV integrated circuit fabrication. Those skilled in the art will understand the many modifications and adaptations of the specific methods and systems described above may be implemented within the spirit and scope of the invention as defined by the following claims.

What is claimed is:

1. A method for defect reconstruction and compensation repair, the method comprising:
   determining, by at least one computing device, a defect starting point of a defect of a mask, the defect starting point comprising a size of the defect and a location of the defect;
   simulating, by at least one computing device, a performance of the mask with the defect;
   comparing, by at least one computing device, the simulated performance of the mask to an empirical analysis of the mask;
   determining, by the at least one computing device, whether the simulated performance of the mask is similar to the empirical analysis of the mask within a predetermined statistical amount, wherein the defect starting point is accepted in the case that the simulated performance of the mask is similar to the empirical analysis of the mask within the predetermined statistical amount, and wherein the defect starting point is modified in the case that the simulated performance of the mask is not similar to the empirical analysis of the mask within the predetermined statistical amount;
   determining, by at least one computing device, a profile of the mask and the defect based on the comparing;
   determining, by at least one computing device, a geometry of the mask based on the profile of the mask and the defect;
   calculating, by at least one computing device, an initial image of the mask geometry with the defect of the mask;
   comparing, by at least one computing device, the initial image of the mask geometry to a target image of the mask; and
   generating a compensated layout from the comparison of the initial image of the mask geometry and the target image of the mask.

2. The method of claim 1, further comprising comparing, by at least one computing device, the initial image to the target image to determine whether the compensation is complete.

3. The method of claim 2, further comprising modifying a layout of the mask in the case that the compensation is not complete.

4. The method of claim 3, further comprising calculating, by at least one computing device, a compensated image from the modified layout.

5. The method of claim 1, the simulating comprising outputting simulation results of through-focus data.

6. The method of claim 1, the determining a defect starting point comprising determining an initial defect size and location from a defect map measurement.

7. The method of claim 1, the empirical analysis of the mask comprising:
   receiving mask data from a inspection tool; and
   processing the mask data to smooth out statistical variations.

8. A computer program product for defect reconstruction and compensation, the computer program product comprising:
   a computer readable storage device storing computer program instructions, the computer program instructions being executable by a computer, the computer program instructions including:
   determining a defect starting point of a defect of a mask;
   simulating a performance of the mask with the defect;
   comparing the simulated performance of the mask to an empirical analysis of the mask;
   determining whether the simulated performance of the mask is similar to the empirical analysis of the mask within a predetermined statistical amount, wherein the defect starting point is accepted in the case that the simulated performance of the mask is similar to the empirical analysis of the mask within the predetermined statistical amount, and wherein the defect starting point is modified in the case that the simulated performance of the mask is not similar to the empirical analysis of the mask within the predetermined statistical amount;
   determining a profile of the mask and the defect based on the comparing;
   determining a geometry of the mask based on the profile of the mask and the defect;

calculating an initial image of the mask geometry with the defect of the mask;

comparing the initial image of the mask geometry to a target image of the mask, the target image generated from a post-optical proximity correction layout; and generating a compensated layout from the comparison of the initial image of the mask geometry to the target image of the mask.

9. The computer program product of claim 8, further comprising computer program instructions including comparing the initial image to the target image to determine whether the compensation is complete.

10. The method of claim 9, further comprising computer program instructions including modifying a layout of the mask in the case that the compensation is not complete.

11. The method of claim 10, further comprising computer program instructions including calculating a compensated image from the modified layout.

12. The method of claim 8, the computer program instructions for simulating further comprising outputting simulation results of through-focus data.

13. The method of claim 8, the computer program instructions for determining a defect starting point further comprising determining an initial defect size and location from a defect map measurement.

14. The method of claim 8, the empirical analysis of the mask further comprising computer program instructions including:

receiving mask data from a inspection tool; and processing the mask data to smooth out statistical variations.

15. A method for extreme ultraviolet (EUV) defect reconstruction and compensation repair, the method comprising the computer-implemented steps of:

determining a defect starting point of a defect of a mask;

simulating a performance of the mask with the defect;

comparing the simulated performance of the mask to an empirical analysis of the mask;

determining whether the simulated performance of the mask is similar to the empirical analysis of the mask within a predetermined statistical amount, wherein the defect starting point is accepted in the case that the simulated performance of the mask is similar to the empirical analysis of the mask within the predetermined statistical amount, and wherein the defect starting point is modified in the case that the simulated performance of the mask is not similar to the empirical analysis of the mask within the predetermined statistical amount;

determining a profile of the mask and the defect based on the comparing;

determining a geometry of the mask based on the profile of the mask and the defect;

calculating an initial image of the mask geometry with the defect of the mask;

comparing the initial image of the mask geometry to a target image of the mask, the target image and the initial image of the mask geometry generated from a post-optical proximity correction layout; and generating a compensated layout from the comparison of the initial image of the mask geometry to the target image of the mask.

16. The method of claim 15, further comprising the computer-implemented steps of:

comparing the initial image to the target image to determine whether the compensation is complete; and modifying a layout of the mask in the case that the compensation is not complete.

17. The method of claim 16, further comprising the computer-implemented step of calculating a compensated image from the modified layout.

18. The method of claim 15, the simulating comprising outputting simulation results of through-focus data.

19. The method of claim 15, the determining a defect starting point comprising determining an initial defect size and location from a defect map measurement.

20. The method of claim 15, the empirical analysis of the mask comprising:

receiving mask data from a inspection tool; and processing the mask data to smooth out statistical variations.

* * * * *